(12) United States Patent
Lee et al.

(10) Patent No.: US 9,312,021 B2
(45) Date of Patent: Apr. 12, 2016

(54) CELL STRING AND READING METHOD FOR THE CELL STRING

(71) Applicant: SNU R&DB FOUNDATION, Seoul (KR)

(72) Inventors: Jong-Ho Lee, Seoul (KR); Sung-Min Joe, Daegu (KR)

(73) Assignee: SNU R&DB FOUNDATION (KR)

( * ) Notice: Subject to any disclaimer, the term of this patent is extended or adjusted under 35 U.S.C. 154(b) by 0 days.

(21) Appl. No.: 14/722,605

(22) Filed: May 27, 2015

(65) Prior Publication Data

US 2015/0348639 A1    Dec. 3, 2015

(30) Foreign Application Priority Data

May 30, 2014 (KR) .......................... 10-2014-0065533

(51) Int. Cl.
| | |
|---|---|
| *G11C 16/04* | (2006.01) |
| *G11C 16/26* | (2006.01) |
| *H01L 29/78* | (2006.01) |

(Continued)

(52) U.S. Cl.
CPC ............ *G11C 16/26* (2013.01); *G11C 16/0483* (2013.01); *H01L 27/11556* (2013.01); *H01L 27/11582* (2013.01); *H01L 27/1203* (2013.01); *H01L 29/0649* (2013.01); *H01L 29/42356* (2013.01); *H01L 29/7827* (2013.01); *H01L 29/7831* (2013.01); *H01L 29/7841* (2013.01)

(58) Field of Classification Search
CPC .......... G11C 16/0416; G11C 16/0433; G11C 16/0483
See application file for complete search history.

(56) References Cited

U.S. PATENT DOCUMENTS 8,928,062 B2 *    1/2015    Yasuda ............. H01L 21/28282
                                                                257/297
2007/0235793 A1 *    10/2007    Yamazaki ........... H01L 29/7881
                                                                257/314

(Continued)

FOREIGN PATENT DOCUMENTS

KR    1020090085439    8/2009
KR    1020120130902    12/2012

OTHER PUBLICATIONS

Hang-Ting Lue et al., A Novel Dual-Channel 3D NAND Flash Featuring both N-Channel and P-Channel NAND Characteristics for Bit-alterable Flash Memory and A New Opportunity in Sensing the Stored Charge in the WL Space, IEEE, 2013, pp. 3.7.1-3.7.4.

(Continued)

*Primary Examiner* — Tuan T Nguyen
(74) *Attorney, Agent, or Firm* — Cantor Colburn LLP

(57) ABSTRACT

Provided are a cell string and a reading method for the cell string. The cell string includes a semiconductor body formed on a surface of an insulating layer, first and second semiconductor regions formed at respective ends of the semiconductor body and are formed by being doped with different types of impurities, two or more control electrodes which are separated from each other to be electrically isolated, and a gate insulating film stack which is formed between the semiconductor body and the control electrodes, wherein the semiconductor body is configured to include at least two layers, and adjacent layers of the semiconductor body have different energy band gaps, wherein the semiconductor body is formed by an intrinsic semiconductor or a semiconductor being doped with impurities, and wherein the first and second semiconductor regions are doped with impurities of which concentration is higher than that of the semiconductor body.

16 Claims, 16 Drawing Sheets

(51) Int. Cl.
*H01L 29/423* (2006.01)
*H01L 27/115* (2006.01)
*H01L 29/06* (2006.01)
*H01L 27/12* (2006.01)

(56) References Cited

U.S. PATENT DOCUMENTS

2008/0137394 A1* 6/2008 Shimano ............... G11C 5/063
 365/72
2012/0134208 A1* 5/2012 Lee ................... G11C 11/5642
 365/185.03
2016/0005479 A1* 1/2016 Lee ................... G11C 16/0483
 365/185.12

OTHER PUBLICATIONS

Jaehoon Jang et al., Vertical Cell Array using TCAT(Terabit Cell Array Transistor) Technology for Ultra High Density NAND Flash Memory, Symposium on VLSI Technology Digest of Technical Papers, 2009, pp. 192-193.

* cited by examiner

CELL STRING AND READING METHOD FOR THE CELL STRING

CROSS-REFERENCE TO RELATED PATENT APPLICATION

This application claims the benefit of Korean Patent Application No. 10-2014-0065533, filed on May 30, 2014 in the Korean Intellectual Property Office, the disclosure of which is incorporated herein in its entirety by reference.

BACKGROUND OF THE INVENTION

1. Field of the Invention

The present invention relates to a cell string and a reading method for the cell string, and more particularly, to a cell string wherein a semiconductor body where a channel is formed includes at least two or more layers and adjacent layers are made of materials having different energy band gaps to increase a turn-on current, using positive feedback to obtain steep switching characteristic, and capable of reducing distribution of a turn-on voltage and a reading method for the cell string.

2. Description of the Related Art

Various researches have been made in order to improve a degree of integration and performance of a flash memory device.

A structure of a vertical-type TCAT flash memory cell string for improving the degree of integration is disclosed in "Vertical Cell Array Using TCAT (Tera Cell Array Transistor) Technology for Ultra High Density NAND Flash Memory" (Jaehoon Jang, et al., 2009 Symposium on VLSI Technology Digest of Technical Papers, pp. 192-193) (referred to as Non-Patent Document 1).

FIGS. 1A and 1B are cross-sectional diagrams illustrating a vertical-type TCAT flash memory cell string in X and Y directions disclosed in Non-Patent Document 1. FIGS. 2A and 2B are graphs illustrating a voltage (control gate voltage Vg)–current (bit line current $I_{BL}$) characteristic of the cell string and a distribution of threshold voltage (Vth) with respect to 32 cells of string. In FIGS. 1A and 1B, the aforementioned TCAT flash memory cell string includes a channel region which is formed in the vertical direction on a semiconductor substrate formed as a p− substrate, cell string which includes a plurality of cell devices which are formed in series to be electrically separated from each other and is formed at the side surface of the channel region, and an n+ region which is formed on the semiconductor substrate. The upper portion of the channel region is connected to bit lines BL, and gate electrodes of the cell devices are connected to word lines WL. As illustrated in FIG. 2B, the distribution of the threshold voltage of each cell device in the above-described TCAT flash memory cell string is as wide as 1 V or more.

In addition, a 3D NAND flash memory device having a dual-channel structure is disclosed in "A Novel Dual-Channel 3D NAND Flash Featuring both N-Channel and P-Channel NAND Characteristics for Bit-alterable Flash Memory and A New Opportunity in Sensing the Stored Charge in the WL Space" (Hang-Ting Lue, et al., 2013 IEEE pp. 3.7.1-3.7.4) (referred to as Non-Patent Document 2)

FIGS. 3A and 3B are conceptual diagrams illustrating the 3D NAND flash memory having a dual-gate structure disclosed in Non-Patent Document 2. FIG. 4 is a graph illustrating an Id-Vg characteristic curve of the flash memory.

In the flash memory devices in the related art illustrated in FIGS. 1A and 1B and FIGS. 3A and 3B, the slope is low in the range (sub-threshold) of lower than the threshold voltage Vth, and thus, the distribution of the threshold voltage Vth is wide. As a result, a refresh margin cannot be increased. By increasing the refresh margin, a read time can be shortened. In the range of less than the threshold voltage Vth, the slope of the I-V characteristic curve is as high as about 250 mV/dec. Because the slope of the I-V characteristic curve is very high in the gate structure of FIGS. 1A and 1B where a tubular channel and a gate insulating film stack formed thereon are surrounded and the dual-gate structure of FIGS. 2A and 2B, the distribution of the threshold voltage can be greatly increased. In particular, in the case where the slope in the sub-threshold range is deteriorated due to an increase in program/erase cycle or the like, the distribution of the threshold voltage can be more greatly increased.

SUMMARY OF THE INVENTION

The invention is to provide a cell string capable of achieving a small distribution of threshold voltage and a good refresh margin by using positive feedback.

The invention is also to provide a reading method having steep switching characteristic for a cell string having the above-described structure.

According to an aspect of the invention, there is provided a cell string including a semiconductor body which is formed on a surface of an insulating layer, first and second semiconductor regions which are formed at respective ends of the semiconductor body and are formed by being doped with different types of impurities, two or more control electrodes which are separated from each other to be electrically isolated, and a gate insulating film stack which is formed between the semiconductor body and the control electrodes, wherein the semiconductor body is configured to include at least two layers, and adjacent layers of the semiconductor body have different energy band gaps, wherein the semiconductor body is formed by an intrinsic semiconductor or a semiconductor being doped with impurities, and wherein the first and second semiconductor regions are doped with impurities of which concentration is higher than that of the semiconductor body.

In the above aspect, preferably, the gate insulating film stack is configured to include a tunneling insulating film, a charge storage node, and a blocking insulating film which are stacked in this order from the surface of the semiconductor body.

In the above aspect, preferably, the semiconductor body is configured to include a first layer adjacent to the gate insulating film stack and a second layer adjacent to the insulating layer, the first layer is made of a material of which band gap is larger than that of the second layer, and the second layer is made of a material of which band gap is smaller than that of the first layer.

In the above aspect, preferably, the semiconductor body is configured to include a first layer adjacent to the gate insulating film stack, a third layer adjacent to the insulating layer, and a second layer formed between the first layer and the third layer, the first and third layers are made of Si, and the second layer is made of SiGe.

In the above aspect, preferably, the electrodes located at the respective ends among the two or more control electrodes are connected to a first selection line SL[1] and a second selection line SL[2] for selecting the cell string, respectively.

In the above aspect, the semiconductor body, the the insulating layer, and the gate insulating film stack may be arranged in a direction horizontal to the surface of the semiconductor substrate or in a direction vertical to the surface of the semiconductor substrate, and one end of the semiconductor body may be arranged on the semiconductor substrate.

According to another aspect of the invention, there is provided a reading method for the cell string having the above-described structure, including a step of reading information stored in a charge storage node of an arbitrary selected word line WL[k] of the cell string in a state where n control electrodes in the cell string are connected to respective n word lines WL[0] to WL[n−1], the first semiconductor region is connected to bit lines, and the second semiconductor region is connected to a common source line CSL, wherein the step of reading the information stored in the selected word line includes: a step (r1) of, when the selected word line is the word line WL[k](0<k<n−1), applying a voltage to the word lines of from the word line WL[n−1] to at least word line WL[k−1] and applying a voltage having an opposite polarity to the remaining word lines; a step (r2) of turning off the selection line SL[1] and applying a voltage which is lower than a read voltage ($V_{verify}$) to the selected word line WL[k]; a step (r3) of applying a voltage to the common source line CSL so that a current can flow in the cell string selected in a subsequent step and applying the voltage applied to the common source line CSL to unselected bit lines so that no current flows in a subsequent read operation; and a step (r4) of applying a voltage to the selection line SL[1] so that a selection device connected to the selection line SL[1] is turned on and applying the read voltage ($V_{verify}$) to the selected word line WL[k], wherein in the step (r4), the voltage applied to the selection line SL[1] and the voltage applied to the selected word line WL[k] are applied simultaneously or applied in a reverse order to read the information stored in the selected word line WL[k].

In the above aspect, preferably, in the step (r1), the selection line SL[1] connected to the is applied with a voltage having a polarity same to that of the voltage applied to the word lines WL[n−1] to WL[k−1], the selection line SL[2] connected to the common source line CSL is applied with a voltage having a polarity opposite to that of the voltage applied to the word lines WL[n−1] to WL[k−1], and a selected bit line, unselected bit lines, and the common source line CSL are applied with the same voltage.

In the above aspect, preferably, the reading method further includes a step of, in case of performing sensing all the bit lines, applying the voltage to the common source line CSL in the step (r3), applying a voltage which is lower than the voltage applied to the common source line CSL to all the bit lines of a selected page, and after that, applying the read voltage, so that current can flow in all the cell strings of the selected page.

According to still another aspect of the invention, there is provided a reading method for the cell string having the above-described structure, in a state where n control electrode in the cell string are connected to respective n word lines WL[0] to WL[n−1], the first semiconductor region is connected to bit lines, and the second semiconductor region is connected to a common source line CSL, the reading method including at least steps of: (m1) applying a voltage having the same polarity to all the word lines except for the selected word line (WL[k]) in the cell string, turning on any one of the selection line SL[1] or the selection line SL[2], applying a voltage which is lower than the read voltage ($V_{verify}$) to the selected word line WL[k], and applying the same voltage to all the bit lines and the common source line CSL; and (m2) applying a voltage to the common source line CSL and the unselected bit lines, applying the read voltage ($V_{verify}$) to the selected word line WL[k], and turning on both of the selection line SL[1] and the selection line SL[2] to perform a read operation, thereby reading information stored in the selected word line WL[k].

In a cell string according to the invention, a semiconductor body where a channel is formed includes two or more layers and adjacent layers of the semiconductor body are made of materials having different energy band gaps, so that a large current can flow when the cell string is turned on.

In addition, when a control electrode voltage of a turn-on voltage or more is applied to a certain selected cell by using positive feedback, switching of current rapidly occurs, so that very good switching characteristic is obtained. As a result, a distribution of turn-on voltage can be improved.

In addition, due to a very high slope of an I-V characteristic curve, a refresh margin can be improved, and thus, a read time and a verify time can be shortened.

In addition, due to the very high slope of the I-V characteristic curve, a program time may be shortened.

FIG. 12 is a graph illustrating comparison of I-V characteristics of a device (hereinafter, referred to as an "SiGe structure") where a selection device where a channel is formed is made of materials (for example, Si/SiGe) of two layers having different energy band gaps according to the invention and a flash memory structure (hereinafter, referred to as a "TCAT structure") of the related art illustrated in FIGS. 1A and 1B. When the amounts of charges stored in charge storage nodes are different, the I-V characteristics obtained from the cell strings configured with the aforementioned two different devices are compared. In the SiGe structure according to the invention, a reading method according to the third embodiment is used, $V_{CC}=1$ V, $V_{pass\_UpperWL\&WLk-1}=6.5$ V, $V_{pass\_LowerWL}=-3$ V, $V_{SL1}=2$ V, $V_{SL2}=-2$ V, and pass cells are in a state where the cells are neither programmed (P) nor erased (E). In the TCAT structure of the related art, $V_{CC}=1$ V, $V_{pass}$ 6.5 V, and $V_{SL1}$, $V_{SL2}=2$ V, and pass cells are neither programmed (P) nor erased (E). In addition, it is assumed that, a trap condition obtained from a device having a polysilicon channel in the related art is used for a channel region of each structure.

Referring to FIG. 12, it can be understood that the word line WL[6] is programmed with electrons of $2\times10^{19}$ cm$^{-3}$, the two different cell strings are well operated. The TCAT structure and the structure according to the invention have a difference in switching characteristic. More specifically, the TCAT structure has sub-threshold swing characteristic of 230 mV/dec, and the structure according to the invention has switching swing characteristic of 1 mV/dec or less. Since the structure according to the invention has switching swing characteristic of 1 mV/dec or less, in an MLC (multi-level cell) operation, the distribution of turn-on voltage $V_{on}$ involved with programming (P) or erasing (E) can be decreased, and in the read and verify operations of the MLC, the refresh margin can be increased.

FIG. 13 is a graph illustrating comparison of I-V characteristics of a device (hereinafter, referred to as "a Si structure") where a semiconductor body is configured with a single layer of Si by using a reading method according to the third embodiment and an SiGe structure according to the invention.

As illustrated in FIG. 13, the Si structure device has very steep swing characteristic of the switching, but there is a problem in that, due to a small turn-on current, the refresh margin is small. In the SiGe structure according to the invention, since the distribution of the turn-on voltage $V_{on}$ is ideal and the turn-on current is large, the refresh margin can be increased.

DETAILED DESCRIPTION OF THE PREFERRED EMBODIMENTS

In a cell string according to the invention, a semiconductor body where a channel is formed is configured with two or more layers, adjacent layers of the semiconductor are configured to have different energy band gaps and a diode is configured with a p-type semiconductor region and an n-type semiconductor region which are formed at two ends of the semiconductor body, respectively. Therefore, a current in the turn-on state is increased. In reading of a specific cell device in the cell string, predetermined voltages are applied to cell string selection devices, a selected cell device, and unselected cell devices, so that positive feedback occurs. As a result, at a specific control electrode voltage of the selected cell device, a current is greatly increased, so that switching occurs. A distribution of voltage where the switching occurs is greatly decreased in comparison with a distribution of threshold voltage in a NAND flash memory in the related art, so that a good refresh margin is obtained.

Figure 5:
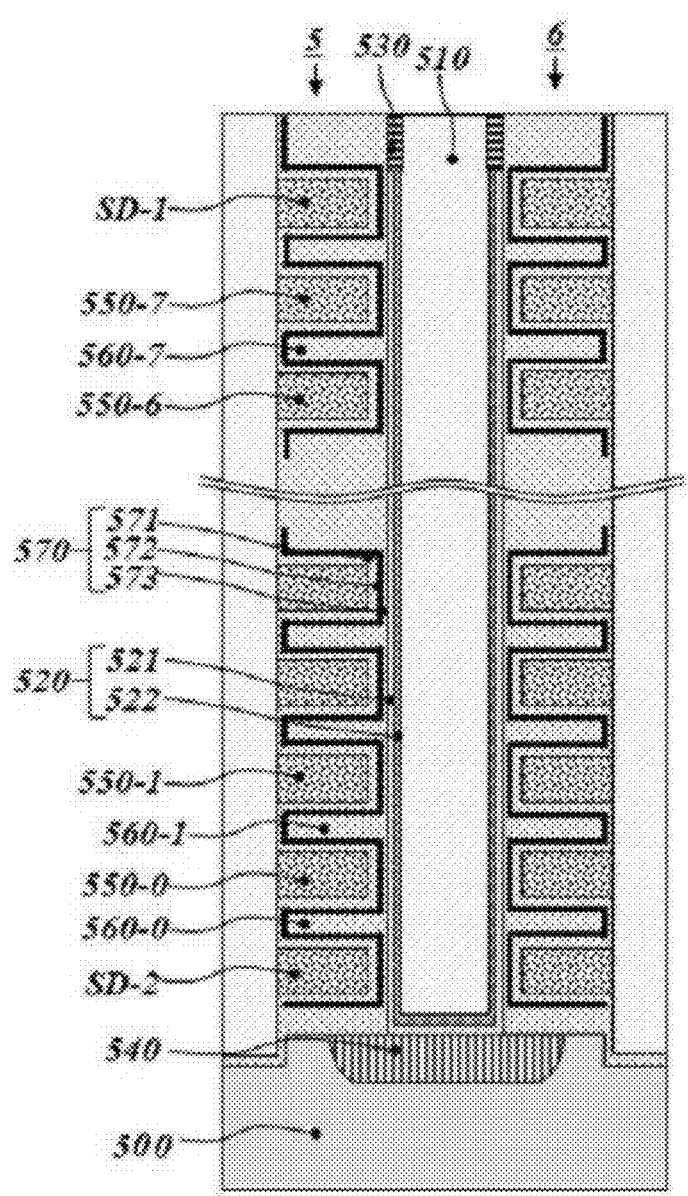
FIG. 5 is a cross-sectional diagram illustrating a cell string according to a first embodiment embodiment of the invention.

Hereinafter, a structure and operations of a cell string according to a first embodiment of the invention will be described in detail. FIG. 5 is a cross-sectional diagram illustrating the cell string according to the first embodiment embodiment of the invention. In FIG. 5, as an example of the invention, the cell string is formed in the vertical direction. However, the device structure and operation method of the invention can be applied to the case where the cell string is formed in the horizontal direction.

Referring to FIG. 5, the cell string according to the embodiment is formed on a semiconductor substrate in the vertical direction. For example, the cell string is configured to include eight cell devices and two selection devices (SDs) at the two ends of the cell string. In the structure illustrated in the cross-sectional diagram of FIG. 5, a semiconductor body 520 where a channel will be formed is configured to have a tubular shape, a gate insulating film stack 570 is also configured to have a tubular shape, and the gate insulating film stack is surrounded by control electrodes. This structure is clearly illustrated in the cross-sectional diagram. Referring to FIG. 5, the cell string 5 according to the embodiment is configured to include a semiconductor substrate 500, an insulating layer 510, a semiconductor body 520, a diode which includes a first semiconductor region 530 and a second semiconductor region 540, a plurality of control electrodes 550-0, 550-1, ..., 550-7 which are electrically insulated from each other, separation insulating layers 560-0, 560-2, ..., 560-7 which are formed between the control electrodes, and a gate insulating film stack 570 which is formed between the control electrodes and the semiconductor body.

The cell string may further include first and second selection devices SD-1 and SD-2 at the two ends of the control electrode. The first and second selection devices SD-1 and SD-2 are electrically separated from each other by the control electrodes and the separation insulating layers.

For example, the control electrodes of the cell string having the above-described configuration are connected to respective word lines, and the first and second selection devices SD-1 and SD-2 are connected to respective selection lines SL[1] and SL[2]. The first semiconductor region 530 is connected to a bit line, and the second semiconductor region 540 is connected to common source line CSL.

Hereinafter, the above-described components of the first embodiment of the invention will be described in detail.

The insulating layer 510 is formed to have a cylindrical shape on a surface of the semiconductor substrate 500 in the vertical direction, and the semiconductor body 520 is formed on a surface of the insulating layer.

The cell string includes the diode configured with the first and second semiconductor region 530 and 540 arranged at the two ends of the semiconductor body 520. The first semiconductor region and the second semiconductor region are doped with opposite type impurities. The semiconductor body 520 is configured to include at least two layers 521 and 522. Preferably, the layers of the semiconductor body are made of materials having different energy band gaps. The semiconductor body may be configured with an intrinsic semiconductor or may be configured to be doped with a low concentration of impurities. When a forward direction voltage is applied to the first and second semiconductor regions and appropriate voltages are applied to the word line WL and the selection devices, a current flows through the tubular semiconductor body between the first and second semiconductor regions. As a result, a current flows into the bit line connected to the first semiconductor region. In this case, as needed, the bit line is connected to the second semiconductor region.

In the case where the semiconductor body 520 is configured to include two layers as described above, the two layers may be, for example, an Si layer and an SiGe layer. The SiGe layer can increase electron mobility and hole mobility in comparison with the Si layer, so that the SiGe layer can increase a turn-on current. In order to reduce interface charges on an interface between the gate insulating film stack 570 and the semiconductor body 520, the Si layer may be formed to be in contact with the gate insulating film stack.

In the case where one layer of the semiconductor body is an SiGe layer and the layer is in contact with one of the gate insulating film stack 570 and the insulating layer 510, in general, there is a problem in that the interface characteristics between the SiGe layer and the insulating film are not good. This problem leads to a deterioration in device characteristics. Therefore, in order to resolve this problem, preferably, a thin Si layer is further formed between the SiGe layer and the insulating film, so that the semiconductor body 520 is configured as Si layer/SiGe layer/Si layer. As a result, the interface characteristics are improved.

The semiconductor body may be formed with polysilicon by vapor deposition of amorphous silicon and thermal treatment. In addition, a poly-Si layer or a poly-SiGe layer may be formed by vapor deposition of amorphous silicon and amorphous SiGe or by vapor deposition of amorphous silicon, amorphous SiGe, and amorphous silicon and thermal treatment. In the case where the amorphous thin film (Si or SiGe) is formed to have a tubular shape and a portion thereof is formed to be in contact with the underlying single crystal semiconductor (for example, silicon) substrate, a size of grain can be increased or a single crystal can be re-grown from the amorphous region which is in contact with the signal crystal semiconductor by controlling subsequent.

The second semiconductor region 540 is formed on the surface of the semiconductor substrate 500 which is in contact with the second end of the semiconductor body 520, and the second semiconductor region 540 is doped with a high concentration of impurities having a type opposite to that of the semiconductor substrate. The first semiconductor region 530 is formed on the first end facing the second end of the semiconductor body 520, and the first semiconductor region 530 is doped with a high concentration of impurities having a type opposite to that of the impurities of the second semiconductor region. The first and second semiconductor regions are configured with, for example, p+ and n+ regions or n+ and p+ regions to constitute the diode.

Therefore, when a forward direction voltage is applied to the diode arranged at the two ends of the semiconductor body 520 and appropriate voltages are applied to the word line WL and the selection devices, a current flows through the tubular semiconductor body between the first and the second semiconductor regions. As a result, the first and second semiconductor regions operate as a diode.

The gate insulating film stack and the control electrode are formed on the outer surface of the tubular semiconductor body to constitute the cell device. The cell devices are connected in series in the cell string direction, and the control electrodes are electrically isolated from each other to constitute the cell string. For example, the control electrodes of the cell devices are connected to the word lines WLs respectively, and the first semiconductor region is connected to the bit line BL to constitute the cell string having a structure where the word lines are stacked. The second semiconductor region is connected to the common source line CSL.

Figure 1A:
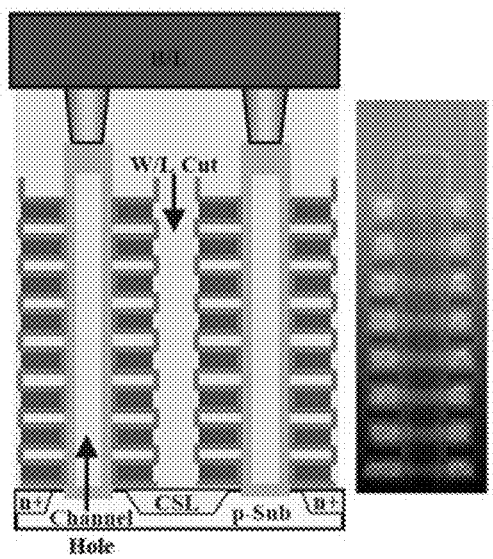
FIGS. 1A and 1B are cross-sectional diagrams illustrating a vertical-type TCAT flash memory cell string in X and Y directions disclosed in Non-Patent Document 1.
Figure 1B:
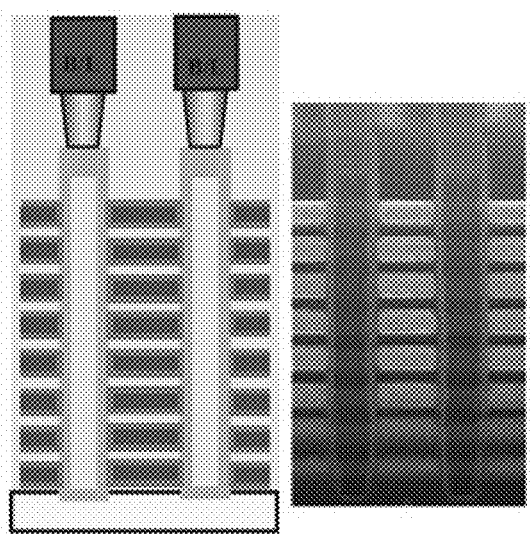
Figure 2A:
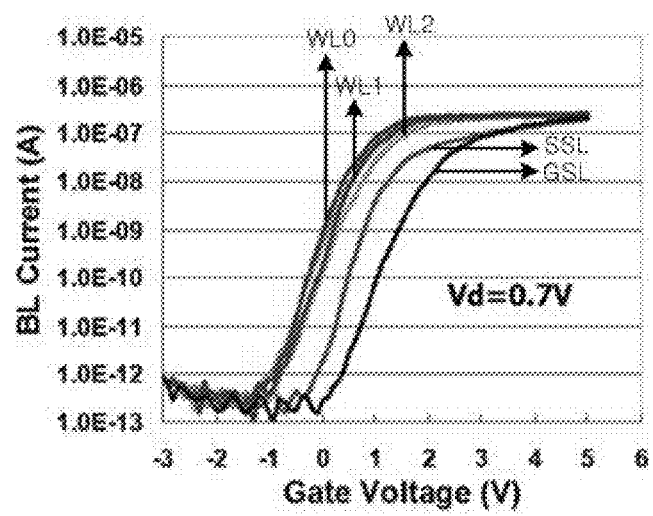
FIGS. 2A and 2B are graphs illustrating a voltage (control gate voltage Vg)–current (bit line current $I_{BL}$) characteristic curve of the cell string and a distribution of threshold voltage with respect to 32 cells of a string.
Figure 2B:
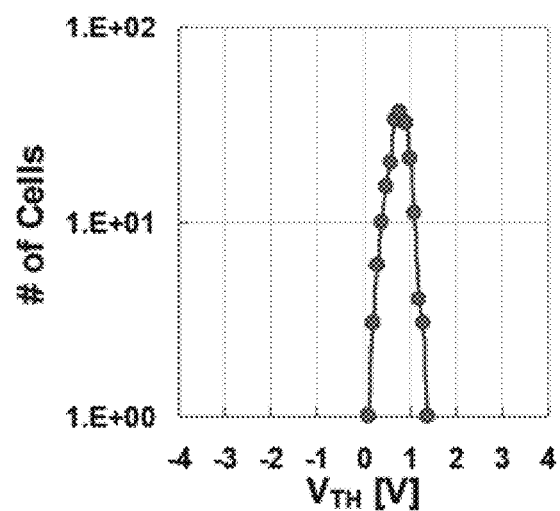
Figure 3A:
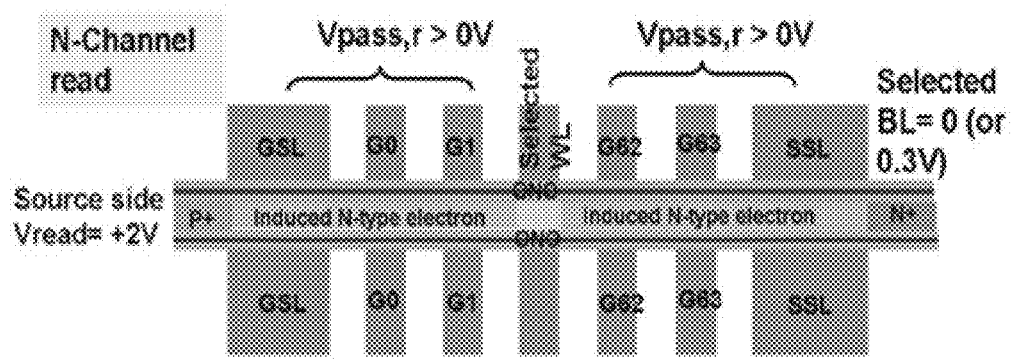
FIGS. 3A and 3B are conceptual diagrams illustrating a 3D NAND flash memory having a dual-gate structure disclosed in Non-Patent Document 2.
Figure 3B:
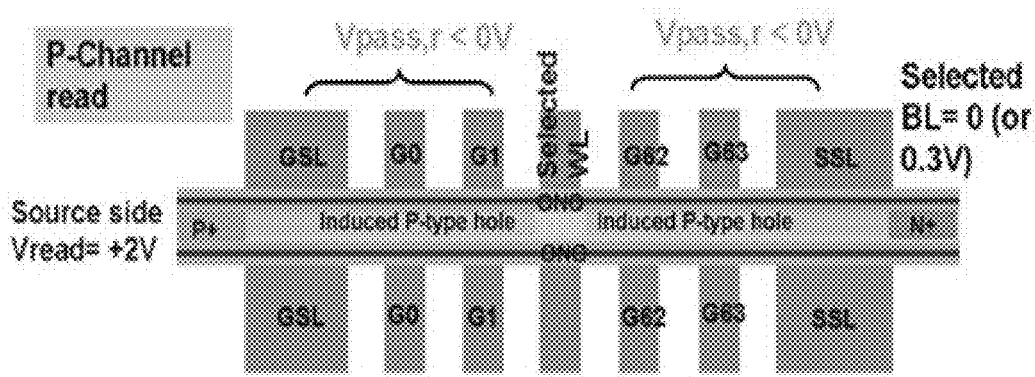
Figure 4:
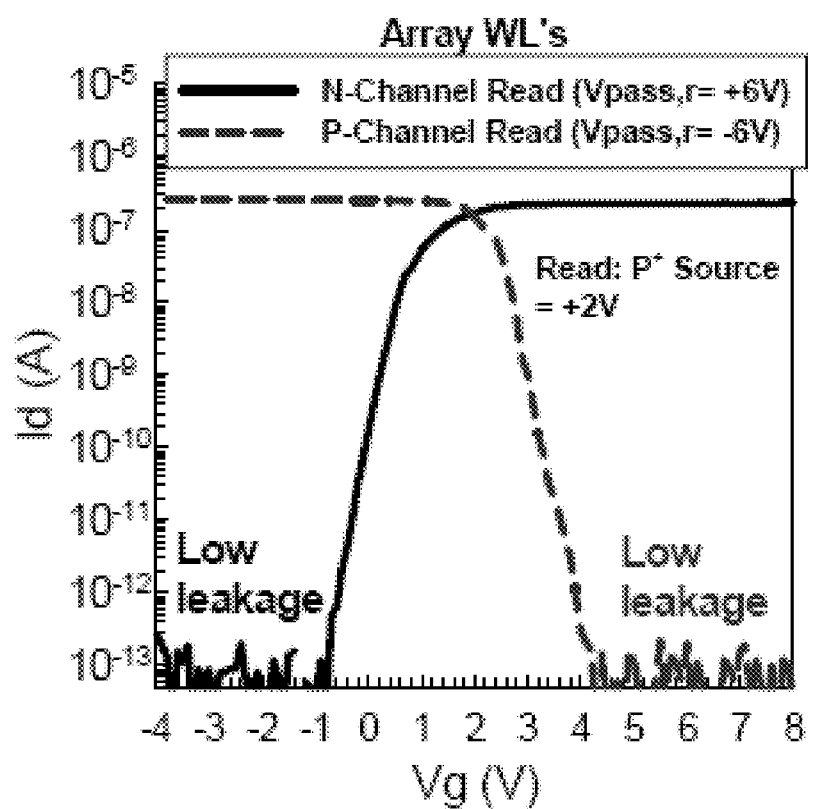
FIG. 4 is a graph illustrating an Id-Vg characteristic curve of the flash memory.

In the cell string according to the embodiment, as an example of the invention illustrated in FIG. 5, the insulating layer is configured to have a cylindrical shape, and the semiconductor body is configured to have a shape surrounding the outer circumferential surface of the insulating layer. In addition, although not shown in the drawings, similarly to the invention, a semiconductor body is configured to include at least layers formed with semiconductor materials having different band gaps, and the semiconductor body may be applied to various vertical-type and horizontal-type NAND flash memory cell strings. On the other hand, as described below in the second embodiment illustrated in FIG. 7, a cell string may be configured so that a channel is formed on an SOI substrate in the horizontal direction. As illustrated in FIGS. 3A and 3B, the structure of the semiconductor body according to the invention may be applied to the 3D NAND flash memory where the semiconductor body is formed in the horizontal direction. In the second embodiment illustrated in FIG. 7, the control electrode may be formed in a single-gate structure, a dual-gate or triple-gate structure, or a GAA (Gate All Around) structure.

Figure 6:
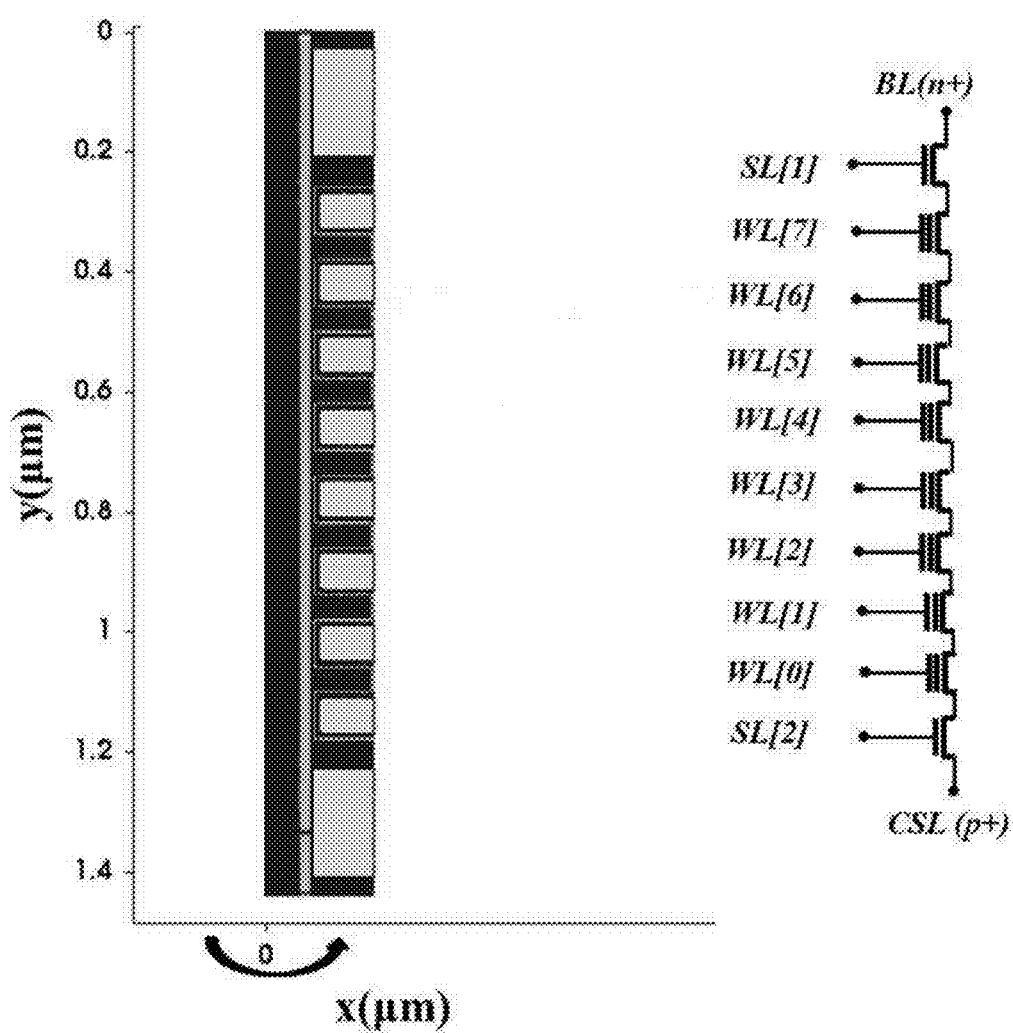
FIG. 6 illustrates a cross-sectional diagram of the cell string according to the first embodiment of the invention illustrated in FIG. 5 and a circuit diagram thereof.

FIG. 6 illustrates a cross-sectional diagram of the cell string according to the first embodiment of the invention illustrated in FIG. 5 and a circuit diagram thereof. Referring to FIG. 6, the cell string includes eight cell devices. The control electrodes of the cell devices are connected to the respective word line WL. The cell string further includes the selection devices SD-1 and SD-2 for selecting the cell string, and the selection devices are connected to the selection lines SL[1] and SL[2], respectively. For example, the first semiconductor region which is an n+ region constituting the diode is connected to the bit line BL, and the second semiconductor region which is a p+ region is connected to the common source line CSL.

Figure 7:
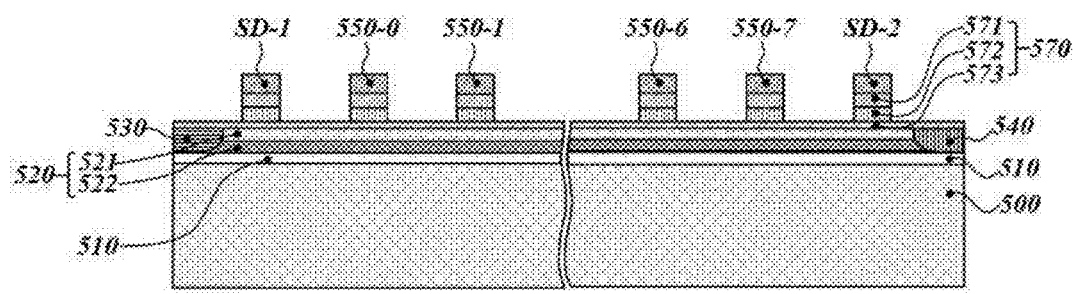
FIG. 7 is a cross-sectional diagram illustrating a cell string according to a second embodiment of the invention.

FIG. 7 is a cross-sectional diagram illustrating a cell string according to a second embodiment of the invention. Referring to FIG. 7, the cell string according to the second embodiment of the invention is configured so that a channel is formed on an SOI substrate in the horizontal direction. The cell string according to the second embodiment is the same as the cell string according to the first embodiment in terms of the structures of the components and the operations of the cell string except for the direction of the channel.

Figure 8:
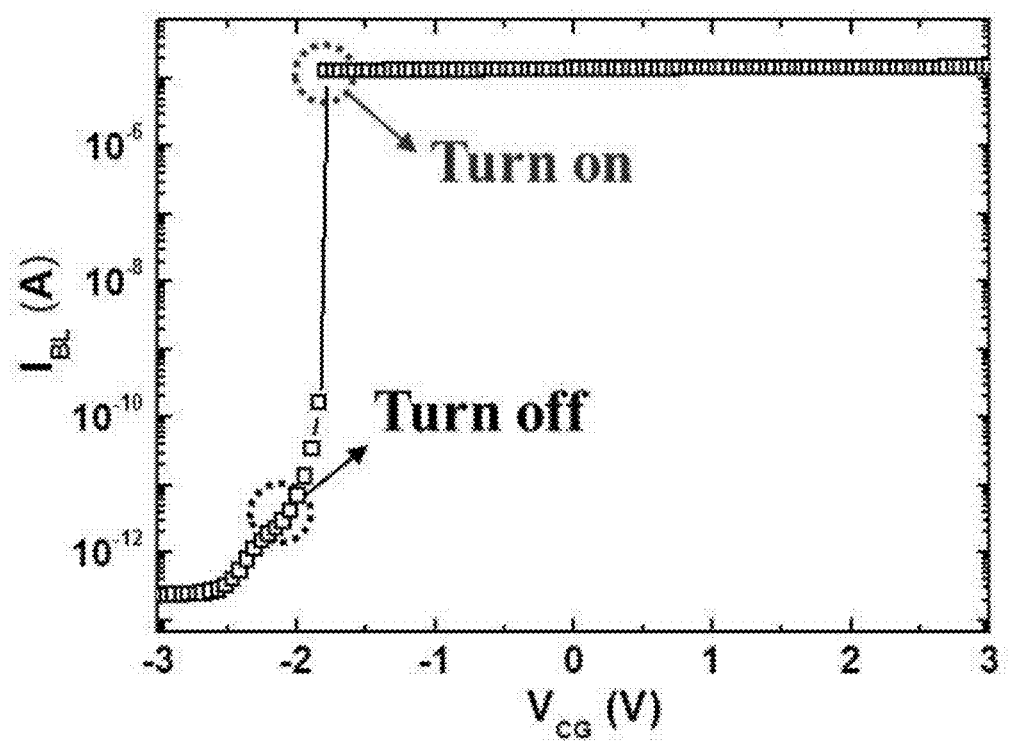
FIG. 8 is a graph illustrating a current ($I_{BL}$: bit line current)–voltage ($V_{CG}$: voltage applied to a control electrode of a selected WL cell) characteristic curve of a cell string having the structures according to the embodiments of the invention.

FIG. 8 is a graph illustrating a current ($I_{BL}$: bit line current)–voltage ($V_{CG}$: voltage applied to a control electrode of a selected WL cell) characteristic curve of a cell string having the above-described structures according to the embodiments of the invention. Referring to FIG. 8, when a predetermined voltage is applied, a turn-on current flows, so that the cell string is switched from a turn-off state to a turn-on state. This phenomenon occurs due to positive feedback in the read operations of the flash memory cell string according to the invention. This will be described more in detail with reference to FIG. 9.

Figure 9:
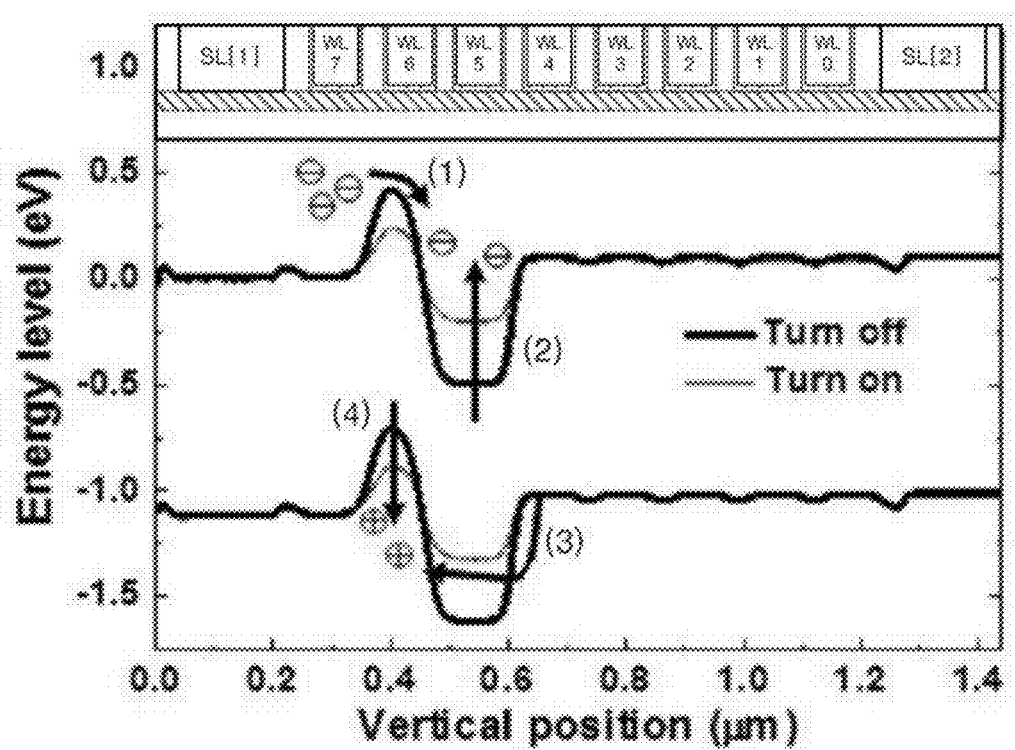
FIG. 9 is an energy band diagram for explaining a read mechanism using positive feedback in the cell string having structures according to the embodiments of the invention.

FIG. 9 is an energy band diagram for explaining a read mechanism using positive feedback in read and verify operations of the cell string having structures according to the embodiments of the invention. As an example, the read mechanism of reading information stored in the selected WL[k] cell (for example, the WL[6] cell) will be described with reference to FIG. 9.

In FIG. 9, the x axis denotes a vertical position of the semiconductor body, and the y axis denotes an energy level at the vertical position. In the turn-off state, due to a high potential barrier, electrons and holes cannot flow as indicated by solid lines. When a certain number of charges are supplied to the floating channel of the WL[k−1] cell (=WL[5] cell) as indicated by (1), the potential of the floating channel is increased as indicated by (2). Therefore, the potential barrier of the floating channel of the WL[5] cell is lowered as indicated by (3), holes are diffused into the channel of the selected WL[6] cell. As indicated by (4), the holes supplied in this manner decreases the potential (potential barrier with respect to the electrons) of the channel of the selected WL[6] cell, so that the number of electrons which flow into the floating channel of the WL[5] cell is greatly increased. Due to the positive feedback of (1)->(2)->(3)->(4), the current is greatly increased, the cell string is switched from the turn-off state to the turn-on state with a very steep slope.

(Reading Method)

A third embodiment of the invention relates to a reading method for an arbitrary cell in the cell string having the above-described structures according to the first and second embodiments of the invention. In the embodiment, a switching characteristic curve has an almost vertical slope.

The reading method of the cell string according to the third embodiment of the invention includes a pre-charging step and a reading step. In the embodiment, the pre-charging step may not be included. However, in terms of durability, it is preferable that the pre-changing step be included. The reading method according to the invention denotes a general read operation or denotes a verify operation after programming or erasing operation.

Figure 11:
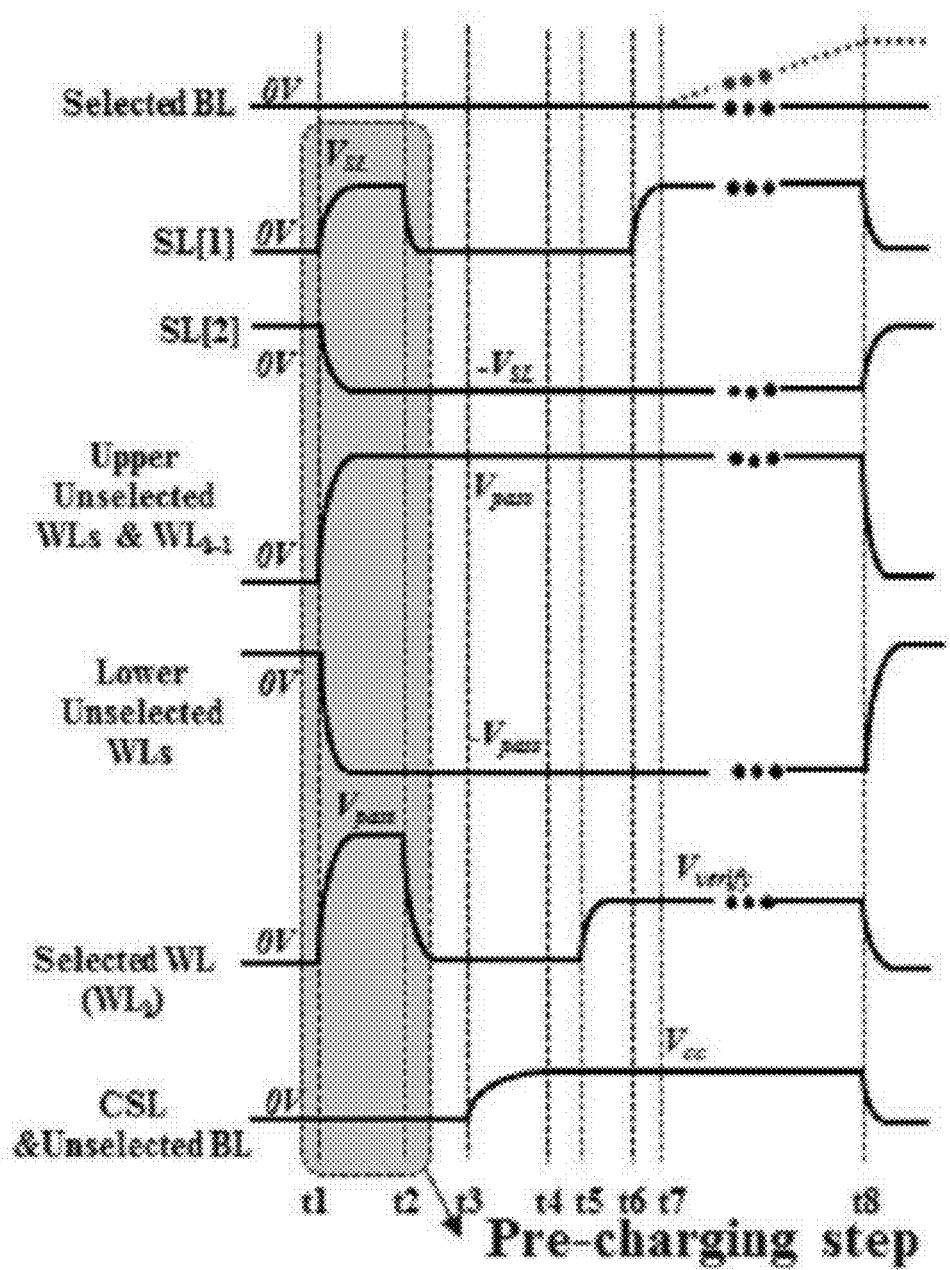
FIG. 11 is a graph illustrating states of bias applied to lines of a cell string for explaining a reading method according to a third embodiment of the invention.

Hereinafter, the reading method according to the embodiment will be described in detail with reference to FIGS. 11 to 16. FIG. 11 is a graph illustrating states of bias applied to lines of a cell string for explaining a reading method according to the third embodiment of the invention. FIGS. 14A to 14E are energy band diagrams at steps t2, t3, t4, t6, and t7 of FIG. 11.

Referring to FIGS. 11 and 14A to 14E, the reading method for the cell string having the above-described structures according to the invention includes a pre-charging step and a reading step for reading a selected word line cell (WL[k] cell).

Herein, one cell string includes n word lines (WL[0] to WL[n−1]) and two selection devices.

Figure 14A:
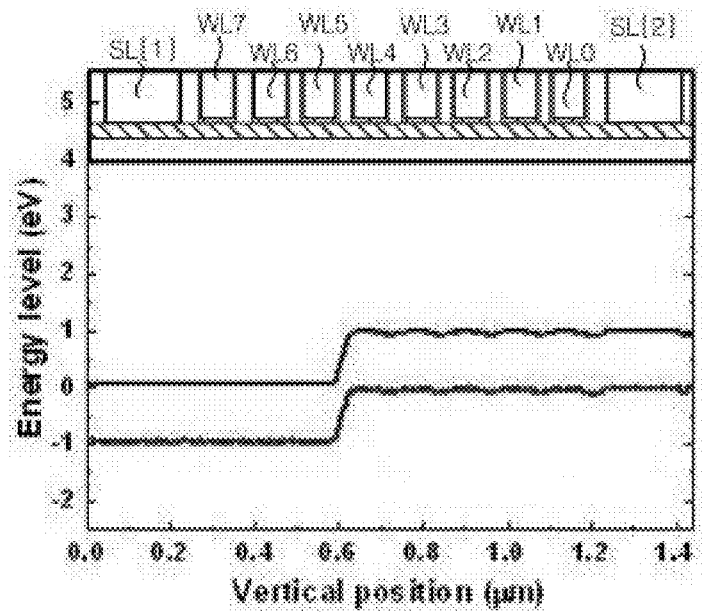
FIGS. 14A to 14E are energy band diagrams at steps t2, t3, t4, t6, and t7 of FIG. 11.

In the pre-charging step, voltages $V_{SL}$ and $-V_{SL}$ are applied to the string selection lines SL[1] and SL[2], respectively; a positive pass voltage ($+V_{pass}$) is applied to the selected word line cell (WL[k] cell), the upper word line cells (Upper WL cells) of the selected word line cell (WL[k] cell), the lower word line cell (WL[k−1] cell) adjacent to the selected word line cell (WL[k] cell); and a negative pass voltage ($-V_{pass}$) is applied to the lower word line cells (Lower WL cells) excluding the WL[k−1] cell. As a result, and holes are supplied from the bit line BL and the common source line CSL to the channel. Namely, as illustrated in FIG. 14A, in the period of t1 to t2, by applying the positive pass voltage to the selection line SL[1] and the upper word lines WL[n−1] to WL[k−1] (for example, in FIG. 6, n=8 and k=6), the electrons are supplied from the bit lines to the channel of the cell string; and by applying the negative pass voltage to the selection line SL[2] and the lower word lines WL[k−2] to WL[0], the holes are supplied from the common source line CSL to the channel of the cell string. The above-described voltage bias is preferred. Alternatively, the word lines WL[n−1] to WL[k−2] or the word line WL[k−3] may also be applied with the positive pass voltage to be operated. As the number of word lines applied with the positive pass voltage is increased, the diffusion length of the holes which are to be diffused from the channel in the cell string may be increased.

Figure 14B:
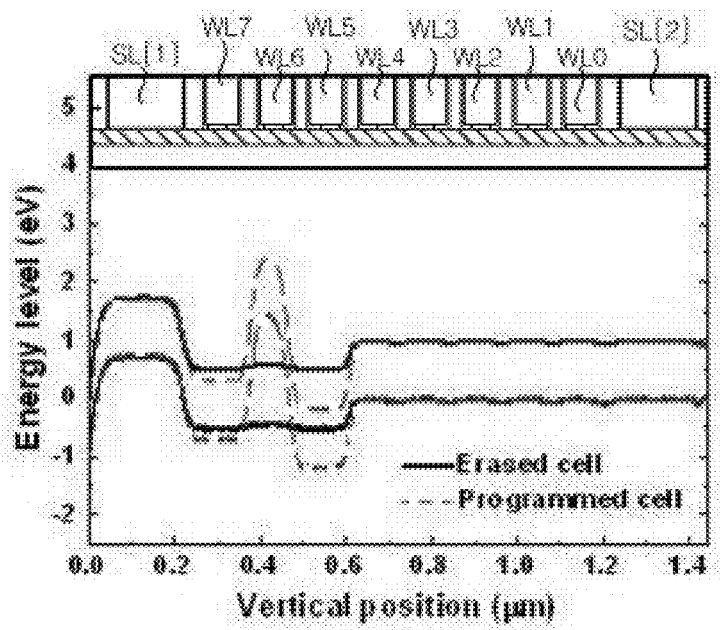
Figure 14C:
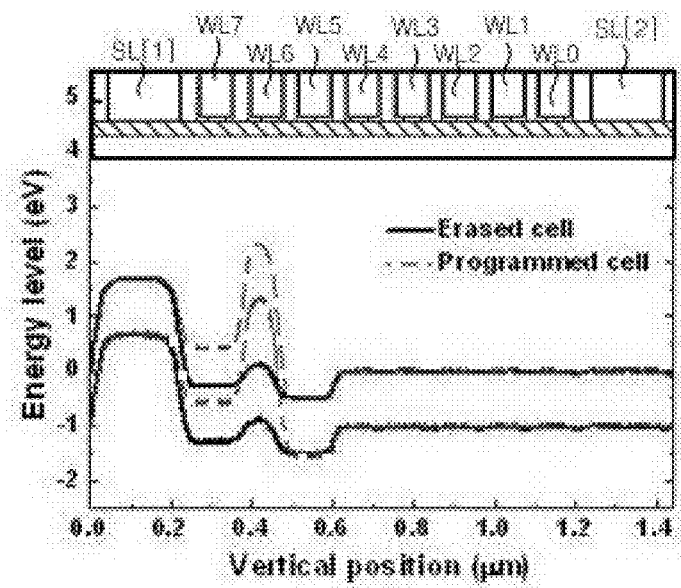
Figure 14D:
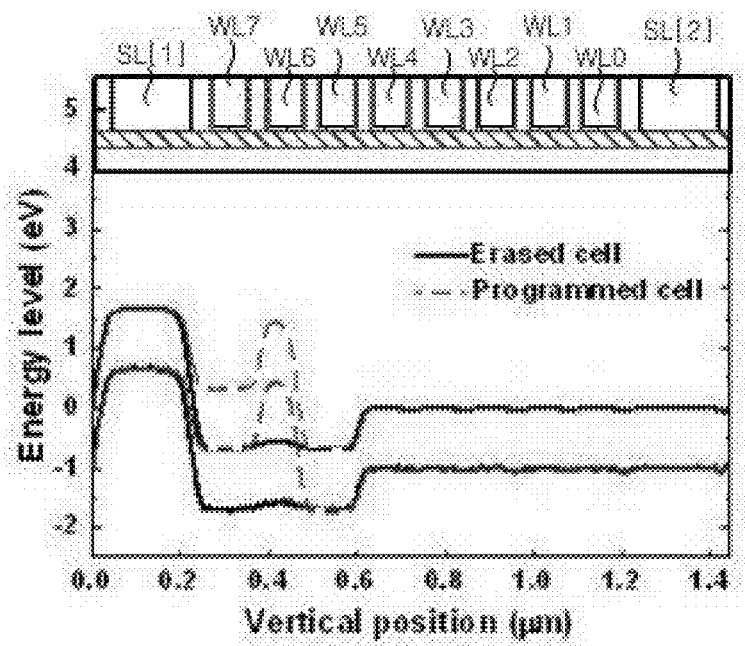
Figure 14E:
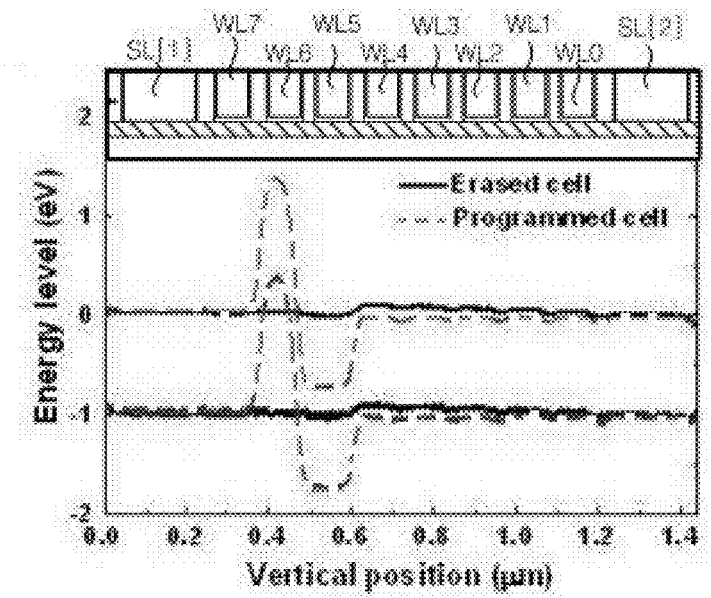

The steps of the reading step will be described more in detail with reference to FIG. 14B to 14E. First, as illustrated in FIG. 14B, in the period of t2 to t3, in order to charge a CSL node, a turn-off voltage and a voltage (for example, 0 V) lower than the read voltage $V_{verify}$ are applied to the selection line SL[1] and the selected word line WL[k], respectively. Next, as illustrated in FIG. 14C, in the period of t3 to t4, the CSL node and the unselected bit lines BLs are charged with $V_{cc}$, no current flows. This operation can be effectively applied so as to distinguish the even bit lines BLs and the odd bit lines BLs in reading. In the case of sensing all the bit lines BLs, there is no need to distinguish the selected bit line BL and the unselected bit lines BLs. Next, as illustrated in FIG. 14D, in the period of t5 to t6, the read voltage $V_{verify}$ is applied to the selected word line WL[k]. Next, as illustrated in FIG. 14E, in the period of t6 to t7, the turn-on voltage is applied to the selection line SL[1], and the read operation (verify) is started.

Figure 15:
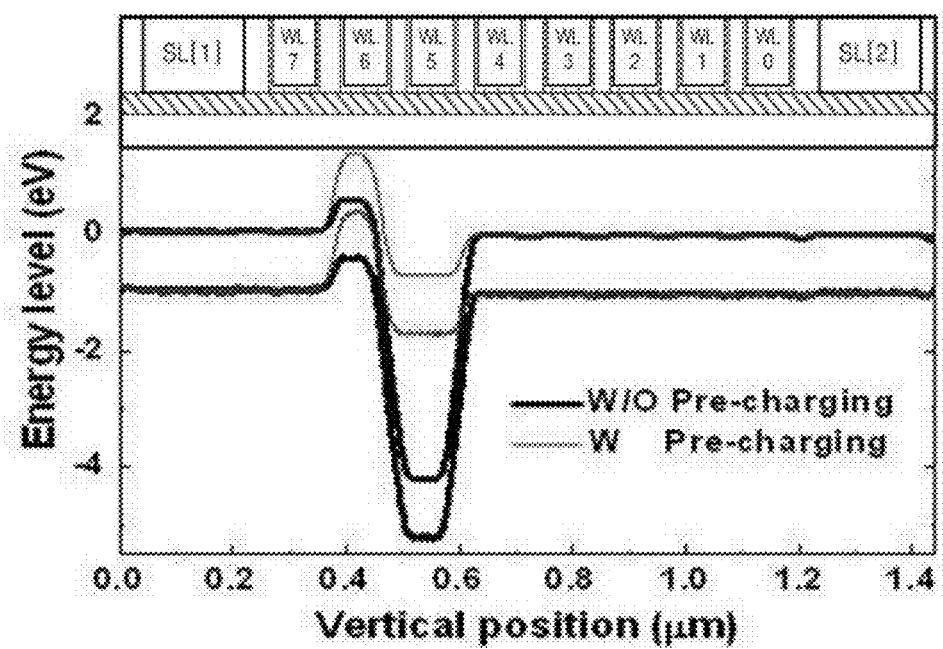
FIG. 15 is a graph illustrating a difference in the energy band diagram according to the presence and absence of a pre-charging step for a portion of channel of the cell string in the reading method according to the third embodiment of the invention.
Figure 16:
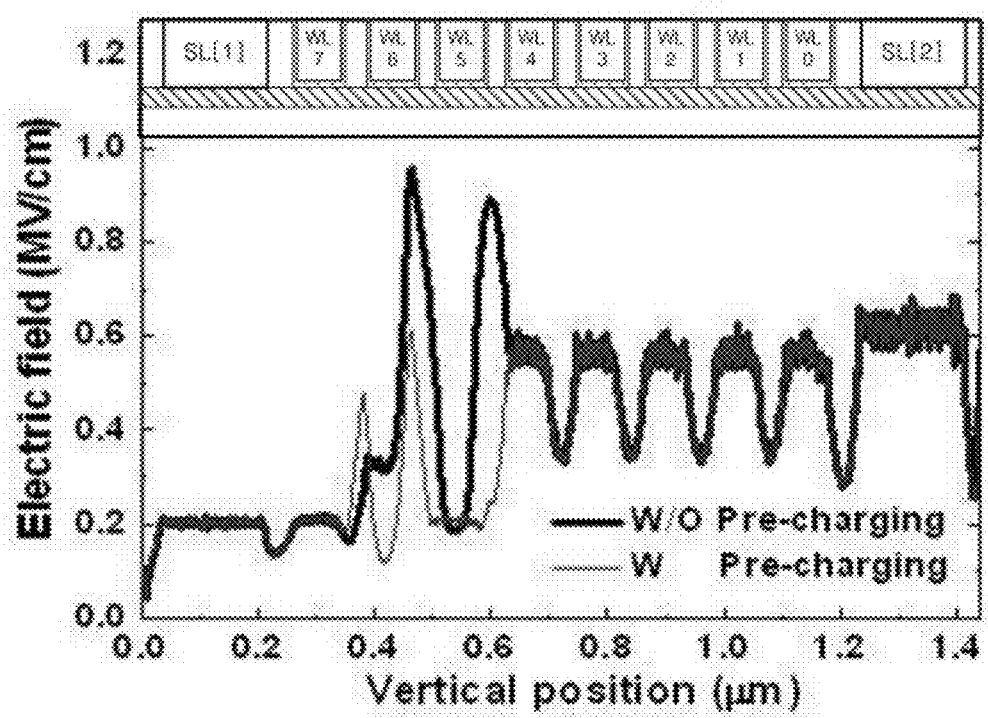
FIG. 16 is a graph illustrating a difference in electric field according to the presence and absence of a pre-charging step for a portion of channel of the cell string in the reading method according to the third embodiment of the invention.

FIGS. 15 and 16 are graphs illustrating a difference in the energy band diagram and a difference in electric field according to the presence and absence of the pre-charging step in the reading method according to the third embodiment of the invention.

Figure 10:
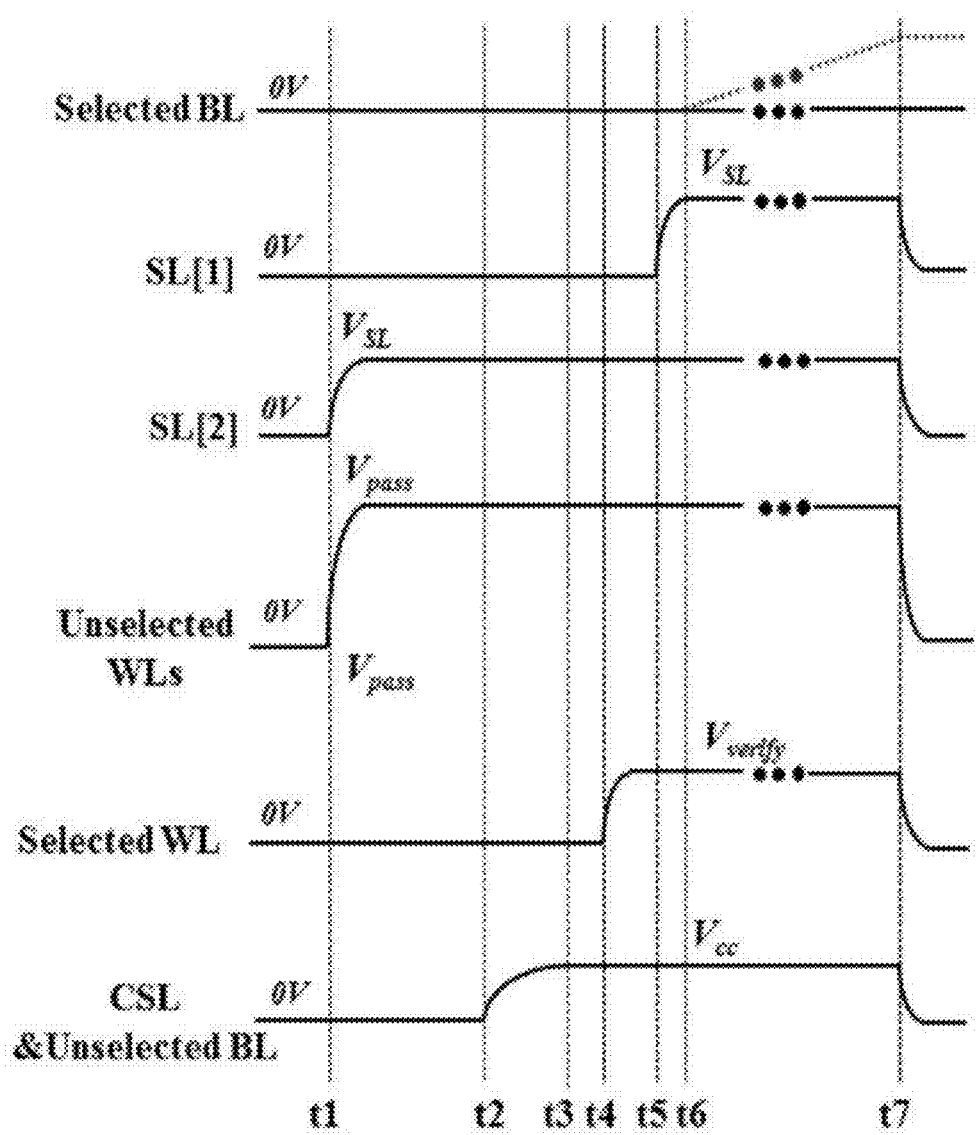
FIG. 10 is a graph illustrating states of bias applied to lines of a cell string for explaining a reading method in the aforementioned structure according to the invention.
Figure 12:
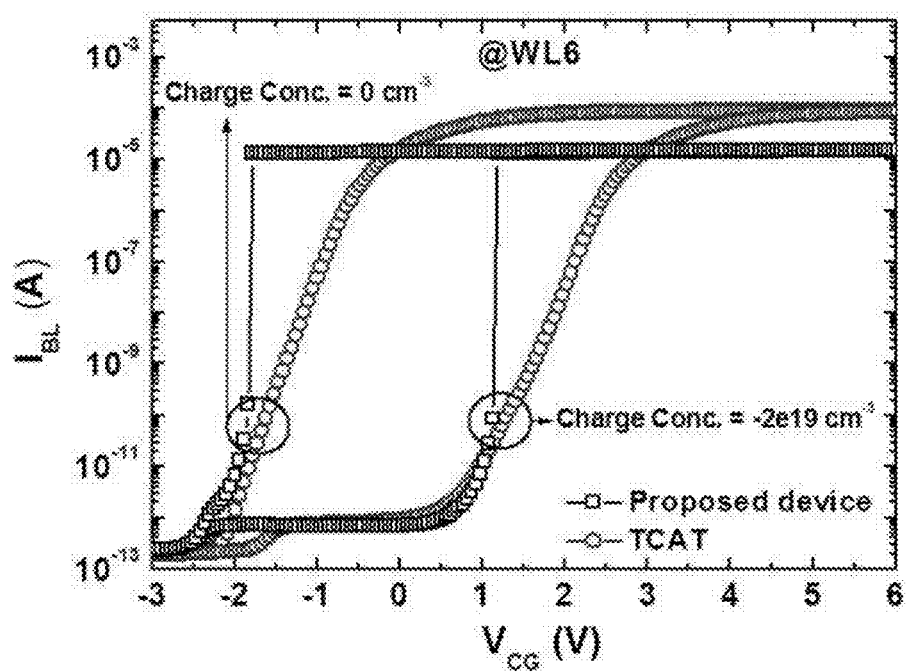
FIG. 12 is a graph illustrating comparison of I-V characteristics of an device having an SiGe structure and a cell string having a TCAT structure according to different charge concentrations stored in a charge storage node in the third embodiment of the invention.
Figure 13:
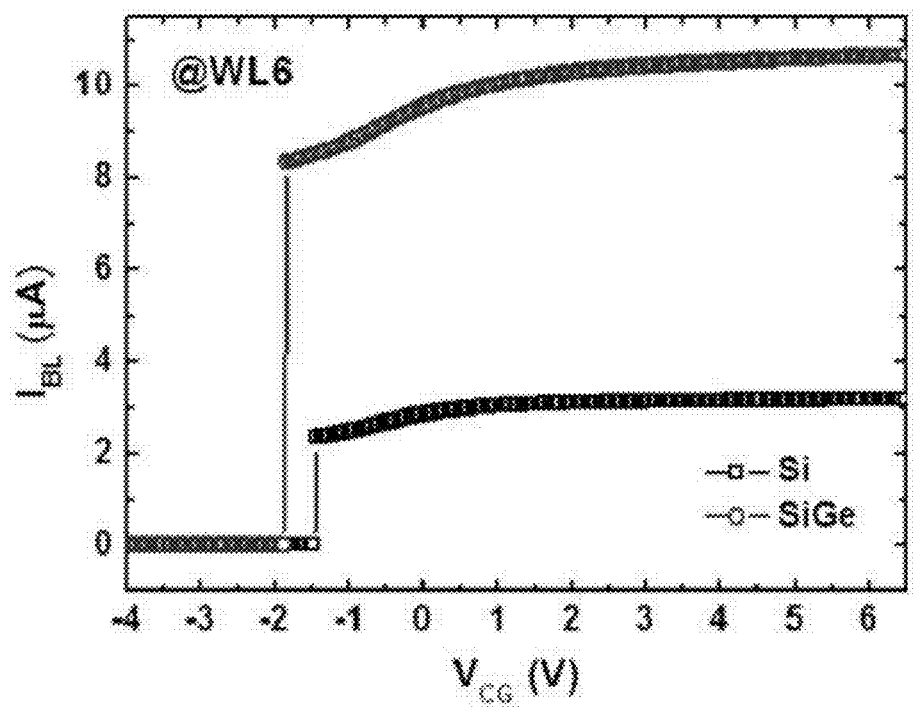
FIG. 13 is a graph illustrating comparison of I-V characteristics of a cell string having an Si structure and a cell string having an SiGe structure as an example of the invention by using the reading method according to the third embodiment of the invention.

As described above, the reading method for the cell string according to the third embodiment of the invention includes the pre-charging step and the reading step. Herein, the pre-charging step may be selectively included. In the case where the pre-charging step is not included, the potential of the channel of a pass cell (herein, the WL[5] cell) is boosted by the pass voltage, a high electric field is generated. Therefore, hot carriers are generated, so that the pass cell and and peripheral pass cells may be deteriorated. However, as illustrated in FIG. 16, in the read operation, the electrons and holes are supplied to the channel by the pre-charging step, so that the potential of the channel of the pass cell WL[5] is not boosted, and the electric field is greatly decreased. In addition, in the case of reading an arbitrary cell in the cell string having the device structure according to the invention by using the method illustrated in FIG. 10, due to traps on the semiconductor body where the channel is formed and the interface, short carrier lifetime of the selection device having a polycrystalline structure, and the like, the switching characteristic is deteriorated, the distribution of the turn-on voltage is increased, and the refresh margin is reduced. However, in the case of using the read method according to the third embodiment for the cell string having the device structure according to the invention, as illustrated in FIG. 12, very good switching characteristic is achieved, so that the device characteristics are improved.

While the present invention has been particularly shown and described with reference to exemplary embodiments thereof, it will be understood by those skilled in the art that various changes and modifications in form and details may be made therein without departing from the spirit and scope of the present invention as defined by the appended claims.

What is claimed is:

1. A cell string comprising:
   an insulating layer;
   a semiconductor body which is formed on a surface of the insulating layer;
   first and second semiconductor regions which are formed at respective ends of the semiconductor body and are formed by being doped with different types of impurities;

two or more control electrodes which are separated from each other to be electrically isolated; and
a gate insulating film stack which is formed between the semiconductor body and the control electrodes,
wherein the semiconductor body is configured to include at least two layers, and adjacent layers of the semiconductor body have different energy band gaps.

2. The cell string according to claim 1,
wherein the semiconductor body is formed by an intrinsic semiconductor or by a semiconductor being doped with impurities, and
wherein the first and second semiconductor regions are doped with impurities of which concentration is higher than that of the semiconductor body.

3. The cell string according to claim 1, wherein the gate insulating film stack is configured to include a tunneling insulating film, a charge storage node, and a blocking insulating film which are stacked in this order from the surface of the semiconductor body.

4. The cell string according to claim 1,
wherein the semiconductor body is configured to include a first layer adjacent to the gate insulating film stack and a second layer adjacent to the insulating layer,
wherein the first layer is made of a material of which band gap is larger than that of the second layer, and
wherein the second layer is made of a material of which band gap is smaller than that of the first layer.

5. The cell string according to claim 1,
wherein the semiconductor body is configured to include a first layer adjacent to the gate insulating film stack, a third layer adjacent to the insulating layer, and a second layer formed between the first layer and the third layer,
wherein the first layer and the third layer are made of a material of which band gap is larger than that of the second layer, and
wherein the second layer is made of a material of which band gap is smaller than those of the first layer and the third layer.

6. The cell string according to claim 1, where the control electrodes located at the respective ends among the two or more control electrodes are connected to a first selection line SL[1] and a second selection line SL[2] for selecting the cell string, respectively.

7. The cell string according to claim 1,
wherein the semiconductor body, the insulating layer, and the gate insulating film stack are arranged in a direction horizontal to the surface of the semiconductor substrate,
wherein the control electrodes are formed to be arranged in a direction vertical to the surface of the semiconductor substrate and to be electrically isolated from each other, and
where each of the control electrodes is formed to have a single-gate structure, a dual-gate or triple-gate structure, or a GAA (Gate All Around) structure.

8. The cell string according to claim 1,
wherein the semiconductor body, the insulating layer, and the gate insulating film stack are arranged in a direction vertical to the surface of the semiconductor substrate, and one end of the semiconductor body is arranged on the semiconductor substrate,
where the control electrodes are formed to be arranged in a direction horizontal to the surface of the semiconductor substrate and to be electrically isolated from each other, and
where one of the first and second semiconductor regions is formed on the surface of the semiconductor substrate.

9. The cell string according to claim 8,
wherein the insulating layer is configured to be in a cylindrical shape on the semiconductor substrate,
where the semiconductor body is configured to have a shape surrounding an outer circumferential surface of the insulating layer, and
where the gate insulating film stack and the control electrodes are sequentially formed on an outer circumferential surface of the semiconductor body.

10. A reading method for the cell string having the structure according to claim 1,
in a state where n control electrodes in the cell string are connected to respective n word lines WL[0] to WL[n−1], the first semiconductor region is connected to bit lines, and the second semiconductor region is connected to a common source line CSL,
the reading method comprising at least a step (r1) of, when a selected word line is the word line WL[k] (0<k<n−1), applying a voltage to the word lines of from the word line WL[n−1] to at least the WL[k−1] and applying a voltage having an opposite polarity to the remaining word lines, thereby reading information stored in the selected word line WL[k].

11. The reading method according to claim 10, wherein in the step (r1), the selection line SL[1] connected to the is applied with a voltage having a polarity same to that of the voltage applied to the word lines WL[n−1] to WL[k−1], the selection line SL[2] connected to the common source line CSL is applied with a voltage having a polarity opposite to that of the voltage applied to the word lines WL[n−1] to WL[k−1], and a selected bit line, unselected bit lines, and the common source line CSL are applied with a same voltage.

12. The reading method according to claim 10, after the step (r1), further comprising a step (r2) of turning off the selection line SL[1] and applying a voltage which is lower than a read voltage ($V_{verify}$) to the selected word line WL[k].

13. The reading method according to claim 12, after the step (r2), further comprising a step (r3) of applying a voltage to the common source line CSL so that a current can flow in the cell string selected in a subsequent step and applying the voltage applied to the common source line CSL to unselected bit lines so that no current flows in a subsequent read operation.

14. The reading method according to claim 13, after the step (r3), further comprising a step (r4) of applying a voltage to the selection line SL[1] so that a selection device connected to the selection line SL[1] is turned on and applying the read voltage ($V_{verify}$) to the selected word line WL[k],
wherein the voltage applied to the selection line SL[1] and the voltage applied to the selected word line WL[k] are applied simultaneously or applied in a reverse order.

15. The reading method according to 13, further comprising a step of, in case of performing sensing all the bit lines, applying the voltage to the common source line CSL in the step (r3), applying a voltage which is lower than the voltage applied to the common source line CSL to all the bit lines of a selected page, and after that, applying the read voltage, so that current can flow in all the cell strings of the selected page.

16. A reading method for the cell string having the structure according to claim 1,
in a state where n control electrode in the cell string are connected to respective n word lines WL[0] to WL[n−1], the first semiconductor region is connected to bit lines, and the second semiconductor region is connected to a common source line CSL,
the reading method comprising at least steps of:
(m1) applying a voltage having the same polarity to all the word lines except for the selected word line (WL[k]) in the cell string, turning on any one of the selection line SL[1] and the selection line SL[2], applying a voltage which is lower than the read voltage ($V_{verify}$) to the selected word line WL[k], and applying the same voltage to all the bit lines and the common source line CSL; and (m2) applying a voltage to the common source line CSL and the unselected bit lines, applying the read voltage ($V_{verify}$) to the selected word line WL[k], and turning on both of the selection line SL[1] and the selection line SL[2] to perform a read operation, thereby reading information stored in the selected word line WL[k].

* * * * *